United States Patent
Miyasaka

(10) Patent No.: US 11,758,337 B2
(45) Date of Patent: Sep. 12, 2023

(54) AUDIO PROCESSING APPARATUS

(71) Applicant: SOCIONEXT INC., Kanagawa (JP)

(72) Inventor: Shuji Miyasaka, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 79 days.

(21) Appl. No.: 17/501,566

(22) Filed: Oct. 14, 2021

(65) Prior Publication Data
US 2022/0038831 A1     Feb. 3, 2022

Related U.S. Application Data

(63) Continuation of application No. PCT/JP2020/001552, filed on Jan. 17, 2020.

(30) Foreign Application Priority Data

Apr. 23, 2019   (JP) ................................ 2019-081394

(51) Int. Cl.
*H04R 25/00* (2006.01)
*G10L 19/02* (2013.01)
*G10L 25/93* (2013.01)

(52) U.S. Cl.
CPC ............ *H04R 25/502* (2013.01); *G10L 19/02* (2013.01); *G10L 25/93* (2013.01); *H04R 25/353* (2013.01)

(58) Field of Classification Search
CPC ..... H04R 25/502; H04R 25/353; G10L 19/02; G10L 25/93
See application file for complete search history.

(56) References Cited

U.S. PATENT DOCUMENTS 6,049,618 A     4/2000 Saltykov
6,993,480 B1 *  1/2006 Klayman ............ G10L 21/0364
                                              704/226

(Continued)

FOREIGN PATENT DOCUMENTS

JP      2002-507355 A     3/2002
JP      2014-209182 A    11/2014

(Continued)

OTHER PUBLICATIONS

International Search Report and Written Opinion issued in corresponding International Patent Application No. PCT/JP2020/001552, dated Mar. 10, 2020, with English translation.

(Continued)

*Primary Examiner* — Mark Fischer
(74) *Attorney, Agent, or Firm* — McDermott Will & Emery LLP

(57) ABSTRACT

An audio processing apparatus includes a preprocessor which extracts a voice-band signal from a first electric signal, and outputs a first output signal containing the voice-band signal; a first controller which generates a first amplification coefficient for multiplying with the first output signal to compress a dynamic range of an intensity of the first output signal, and generates a first modified amplification coefficient by smoothing the first amplification coefficient with a first time constant; and a first multiplier which multiplies the first modified amplification coefficient and the first output signal. The first time constant is a first rise time constant when the intensity increases, and is a first decay time constant when the intensity decreases. The first rise time constant is not less than a temporal resolution of hearing of a hearing-impaired person, and is less than a duration time of sound which induces recruitment in the hearing-impaired person.

7 Claims, 12 Drawing Sheets

(56) References Cited

U.S. PATENT DOCUMENTS

| | | |
|---|---|---|
| 2012/0128178 A1 | 5/2012 | Fujii |
| 2013/0022224 A1 | 1/2013 | Gozen |
| 2014/0297273 A1 | 10/2014 | Suzuki |
| 2017/0134867 A1 | 5/2017 | Miyasaka et al. |
| 2018/0176696 A1 | 6/2018 | Voigt Pedersen |

FOREIGN PATENT DOCUMENTS

| | | |
|---|---|---|
| JP | 2018-137734 A | 8/2018 |
| WO | 2010/137650 A1 | 12/2010 |
| WO | 2012/098856 A1 | 7/2012 |
| WO | 2016/013161 A1 | 1/2016 |

OTHER PUBLICATIONS

Houben, Adrian Carina Henri, The Effect of Amplitude Compression on the Perception of Speech in Noise by the Hearing Impaired [online], 2006 [Retrieved on Mar. 2, 2020]. Internet <URL:https://dspace.library.uu.nl/bitstream/handle/1874/13210/full.pdf>; cited in the ISR.

Meiji Yasuda Life Insurance Company Group Kaigo Joho Site "My Kaigo Hiroba" [online]. [Retrieved on Apr. 5, 2019]. Internet <Url:https://www.mykaigo.com/pub/individual/chiebukuro/taiken/choukaku/0030.html> with English translation.

Akira Takagi, "The Temporal Resolution and Frequency Selectivity in Sensorineral Hearing Loss Patients and Cochlear Implanted Patients", Jibi Inkoka Tenbo (Oto-Rhino-Laryngology, Tokyo), Jibi Inkoka Tenbokai (Society of Oto-Rhino-Laryngology Tokyo), vol. 45, Issue 6, p. 460-468 Dec. 15, 2002 with partial English translation.

\* cited by examiner

| Hearing aid name | ATT | REL |
|---|---|---|
| Hearing aid A | 5 ms | 50 ms - 2000 ms |
| Hearing aid B | 5 ms - 10 ms | 125 ms - 250 ms |

AUDIO PROCESSING APPARATUS

CROSS REFERENCE TO RELATED APPLICATIONS

This is a continuation application of PCT International Application No. PCT/JP2020/001552 filed on Jan. 17, 2020, designating the United States of America, which is based on and claims priority of Japanese Patent Application No. 2019-081394 filed on Apr. 23, 2019. The entire disclosures of the above-identified applications, including the specifications, drawings and claims are incorporated herein by reference in their entirety.

FIELD

The present disclosure relates to an audio processing apparatus.

BACKGROUND

It is known that the following three cautions should be taken to provide sounds easy to hear to hearing-impaired persons (for example, see NPL 1).

Caution 1: Clearly speak in a slightly loud voice, rather than in a loud voice.

Caution 2: Pronounce verbal sounds starting with p, t, k, and s clear and loud.

Caution 3: Emphasize the beginnings of words (or first sounds of the words) by pronouncing the beginnings a little bit longer.

On the other hand, techniques of converting a natural sound to an easy-to-hear sound by digital signal processing have been developed.

In PTL 1, hearing easiness for hearing-impaired persons is improved by making a low voice louder and making a significantly loud voice lower using a dynamic range compression technique.

In PTL 2, hearing easiness for hearing-impaired persons is improved by detecting and emphasizing consonants.

CITATION LIST

Patent Literature

PTL 1: Japanese Patent No. 5149991
PTL 2: Japanese Patent No. 6284003

Non Patent Literature

NPL 1: "MY Kaigo Hiroba", Meiji Yasuda Life Insurance group general caregiving information site [online], [searched on Apr. 5, 2019,] on the Internet <URL: https://www.my-kaigo.com/pub/individual/chiebukuro/taiken/choukaku/0030.html>

NPL 2: Akira Takaki, "Nanchoshano Shuuhasuusentaku-seito Jikanbunkainou (Frequency selectivity and temporal resolution of persons with hearing loss)", Jibiinkouka Tenbo, Jibiinkouka Tenbokai (OTO-RHINO-LARYNGOLOGY, TOKYO), Dec. 15, 2002, Vol. 45, NO. 6, p. 460-468

SUMMARY

Technical Problem

Although the technique disclosed in PTL 1 meets caution 1 above, it is counteractive to caution 3 above. The reason will be described below.

In the case where the dynamic range compression technique is used for a purpose of acoustic aid, the following restriction conditions are caused.

First, as a first restriction condition, an attack time constant (ATT) should be reduced. The attack time constant is a constant for determining how quickly decay processing for reducing the intensity of an input signal with a large intensity is performed. A smaller value of the constant indicates that the decay processing is performed more quickly, and a larger value thereof indicates that the decay processing is performed more slowly. The value should be reduced because recruitment in hearing-impaired persons is avoided. The recruitment is a phenomenon often observed in hearing-impaired persons, and it means hypersensitiveness thereof to signals with large intensities so that those signals sound louder to them than to healthy persons. For this reason, sounds of large volumes unexpectedly generated should be quickly decayed in hearing aid processing for the hearing-impaired persons. Accordingly, the attack time constant (ATT) should be reduced.

Second, as a second restriction condition, a release time constant (REL) should be increased. The release time constant is a constant for determining how quickly amplification processing for increasing the intensity of an input signal having a low intensity is performed. A smaller value of the constant indicates that the amplification processing is performed more quickly, and a large value indicates that the amplification processing is performed more slowly. The release time constant should be increased for the following reason.

According to restriction condition 1, the value of the attack time constant is reduced. Such a reduction in time constant quickly acts on control of the sound volume. This leads to a phenomenon that sounds after processing unnaturally fluctuate in signals whose sound volumes often vary. To suppress such unnatural fluctuation of the sound volumes, the release time constant should be sufficiently larger than the attack time constant.

An example of the time constant determined based on restriction conditions 1 and 2 above in the hearing aid processing will be described with reference to FIG. 14. FIG. 14 is a diagram illustrating an example of the time constant in the hearing aid processing in the related art. As an example of the time constant in the hearing aid processing in the related art, FIG. 14 shows an example of the time constant used in commercially available hearing aids. In the hearing aid processing in the related art, the values of the attack time constant ATT and the release time constant REL are set as shown in FIG. 14, for example, where attack time constant ATT is smaller by about one to two digits than release time constant REL.

As described above, the volumes of the beginnings of the words, when those volumes suddenly increase, are quickly suppressed in the dynamic range compression for the purpose of hearing aid. With respect to caution 3, this suppression acts such that sounds become hard to hear. A requirement that the release time constant should be increased leads to a delay of the original action of hearing aid function to "increase volumes of low-volume sounds".

The technique disclosed in PTL 2 meets caution 2 above while it cannot provide sounds easy to hear because the beginnings of the words starting with vowels are not emphasized.

The present disclosure has been made in consideration of such problems in the related art, and an object of the present disclosure is to provide an audio processing apparatus which can output sounds easy to hear.

Solution to Problem

To solve the above problems, the audio processing apparatus according to one aspect of the present disclosure includes: a first microphone which converts a first sound to a first electric signal; a preprocessor which extracts a voice-band signal from the first electric signal, and outputs a first output signal containing the voice-band signal; a first controller which generates a first amplification coefficient to be multiplied with the first output signal to compress a dynamic range of an intensity of the first output signal, and generates a first modified amplification coefficient by smoothing the first amplification coefficient with a first time constant; and a first multiplier which multiplies the first modified amplification coefficient and the first output signal. The first time constant is a first rise time constant in when the intensity of the first output signal increases, and is a first decay time constant when the intensity of the first output signal decreases, and the first rise time constant is greater than or equal to a temporal resolution of a sense of hearing of a hearing-impaired person, and is less than a duration time of a sound which induces recruitment in the hearing-impaired person.

Thus, by controlling the first rise time constant to be greater than or equal to the temporal resolution of the sense of hearing of the hearing-impaired person, a rapid suppression of the intensity of the sound in the beginning of a word can be prevented. Furthermore, by controlling the first rise time constant to be greater than or equal to the temporal resolution of the sense of hearing of the hearing-impaired person, the amplification coefficient immediately before the rise can be maintained for the first modified amplification coefficient immediately after the rise of the intensity of the first output signal in the beginning of the word. Thereby, the first output signal immediately after the rise is amplified by the first controller. Because the beginning of the word is emphasized as described above, the sound easy to hear can be generated. Moreover, occurrence of the recruitment can be suppressed by controlling the first rise time constant to be less than the duration time of the sound which induces the recruitment in the hearing-impaired person.

Moreover, the audio processing apparatus according to one aspect of the present disclosure may further include a first setter which sets the first rise time constant and the first decay time constant.

In such a configuration, the first rise time constant and the first decay time constant can be set to desired values.

Moreover, in the audio processing apparatus according to one aspect of the present disclosure, the first rise time constant may be a value of 20 msec or more and less than 200 msec.

Thus, a rapid suppression of the intensity of the sound in the beginning of the word can be prevented by controlling the first rise time constant to 20 msec or more. Moreover, occurrence of the recruitment can be suppressed by controlling the first rise time constant to less than 200 msec.

Moreover, in the audio processing apparatus according to one aspect of the present disclosure, the first rise time constant may be greater than the first decay time constant.

Thus, by increasing the first rise time constant, unnatural fluctuation of the sound can be suppressed even when the first decay time constant is small.

Moreover, in the audio processing apparatus according to one aspect of the present disclosure, the preprocessor may include a first filter which extracts the voice-band signal from the first electric signal; and a preprocessing multiplier which multiplies an output signal from the first filter and a preprocess amplification coefficient, and the preprocess amplification coefficient is smaller when an intensity of the output signal from the first filter is lower than a predetermined threshold than when the intensity of the output signal from the first filter is higher than the predetermined threshold.

Thus, amplification of noise components having low intensity can be reduced.

To solve the above problems, the audio processing apparatus according to one aspect of the present disclosure includes: a first microphone which converts a first sound to a first electric signal; a preprocessor which extracts a voice-band signal from the first electric signal, and outputs a first output signal containing the voice-band signal; a first controller which generates a first amplification coefficient to be multiplied with the first output signal to compress a dynamic range of an intensity of the first output signal, and generates a first modified amplification coefficient by smoothing the first amplification coefficient with a first time constant; a first multiplier which multiplies the first modified amplification coefficient and the first output signal; a second microphone which converts a second sound to a second electric signal; a second controller which generates a second amplification coefficient to be multiplied with a second output signal according to the second electric signal to compress a dynamic range of an intensity of the second output signal, and generates a second modified amplification coefficient by smoothing the second amplification coefficient with a second time constant; and a second multiplier which multiplies the second modified amplification coefficient and the second output signal. The first time constant is a first rise time constant when the intensity of the first output signal increases, and is a first decay time constant when the intensity of the first output signal decreases, the second time constant is a second rise time constant when the intensity of the second output signal increases, and is a second decay time constant when the intensity of the second output signal decreases, and the first rise time constant is greater than the second rise time constant.

Thus, by controlling the first rise time constant to be larger than the second rise time constant, a rapid suppression of the intensity of the first sound in the beginning of the word can be prevented, for this reason, a sound easy to hear can be generated.

Moreover, to solve the above problems, one aspect of the present disclosure includes a rise emphasizer to which a voice-band signal is input and which emphasizes a rising portion of the signal only for a predetermined time. The predetermined time is greater than or equal to a temporal resolution of a sense of hearing of a hearing-impaired person, and is less than a duration time of a sound which induces recruitment in the hearing-impaired person.

Thus, by emphasizing the rise portion of the voice-band signal over a time greater than or equal to the temporal resolution of the sense of hearing of the hearing-impaired person, the sound easy to hear to the hearing-impaired person can be generated. Moreover, by controlling the first rise time constant to be less than the duration time of the sound which induces recruitment in the hearing-impaired person, occurrence of the recruitment can be suppressed.

Advantageous Effects

The present disclosure can provide an audio processing apparatus which can output sounds easy to hear.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
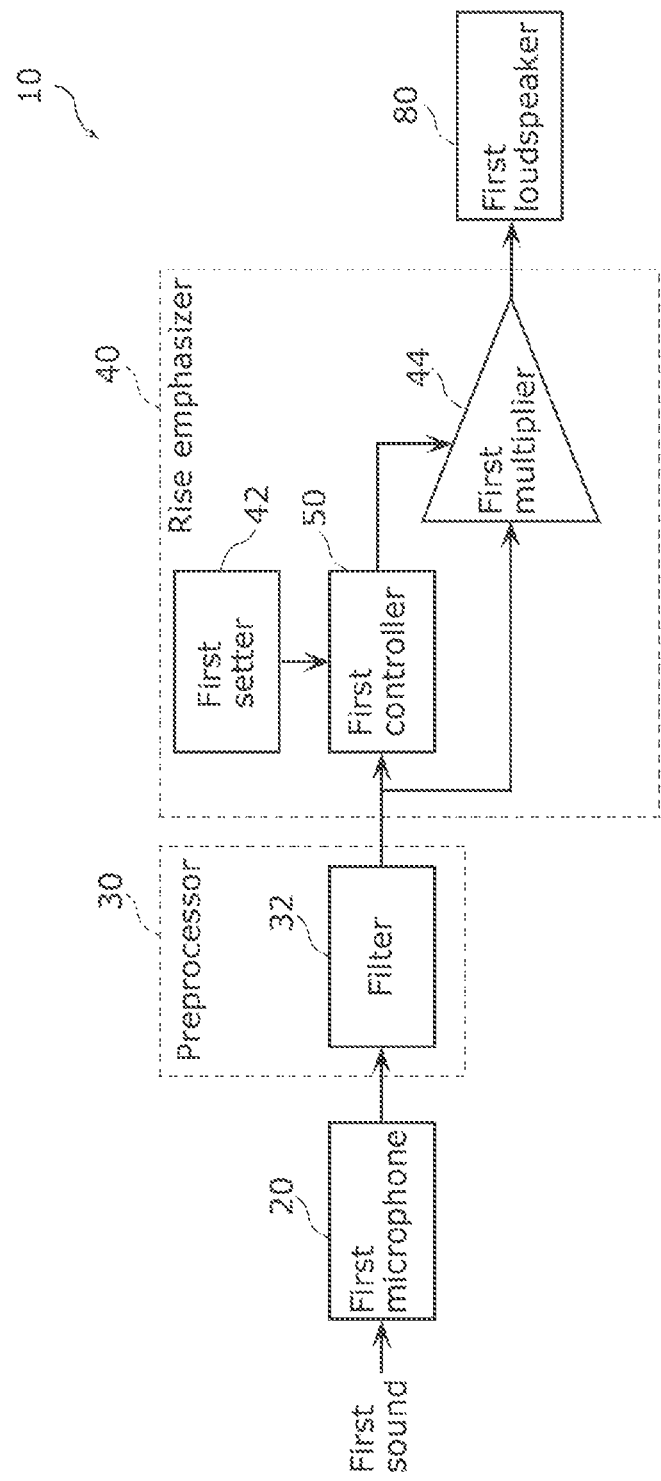
FIG. 1 is a block diagram illustrating one example of the functional configuration of the audio processing apparatus according to Embodiment 1.

Embodiments according to the present disclosure will now be described in detail with reference to the drawings. The embodiments described below all illustrate one specific examples of the present disclosure. Numeric values, shapes, materials, specifications, components, arrangement positions and connections forms thereof, steps, orders of steps, and the like shown in the embodiments below are one examples, and should not be construed as limitations to the present disclosure. Among the components of the embodiments below, the components not described in an independent claim representing the most superordinate concept of the present disclosure are described as arbitrary components. The drawings are not always strictly drawn. In the drawings, identical reference signs will be given to substantially identical configurations, and the duplications of the descriptions may be omitted or simplified in some cases.

(How One Aspect According to the Present Disclosure Was Obtained)

Among the cautions to be taken to provide sounds easy to hear to hearing-impaired persons described in Background above, caution 1 and caution 3 may contradict each other. Caution 1 states that sounds with a large intensity should not be uttered. In contrast, caution 3 states that utterance of sounds with a large intensity is recommended for the beginnings of words (rises).

However, these cautions can be compatible by the following approach. In other words, a consideration may be taken such that a sound with a large intensity is uttered at the beginning of a word but does not persist to induce the recruitment. Here, the time length suitable for uttering a sound with a large intensity at the beginning of a word is analogized with reference to recent research findings from auditory psychology (NPL 2).

Figures 14, 15:
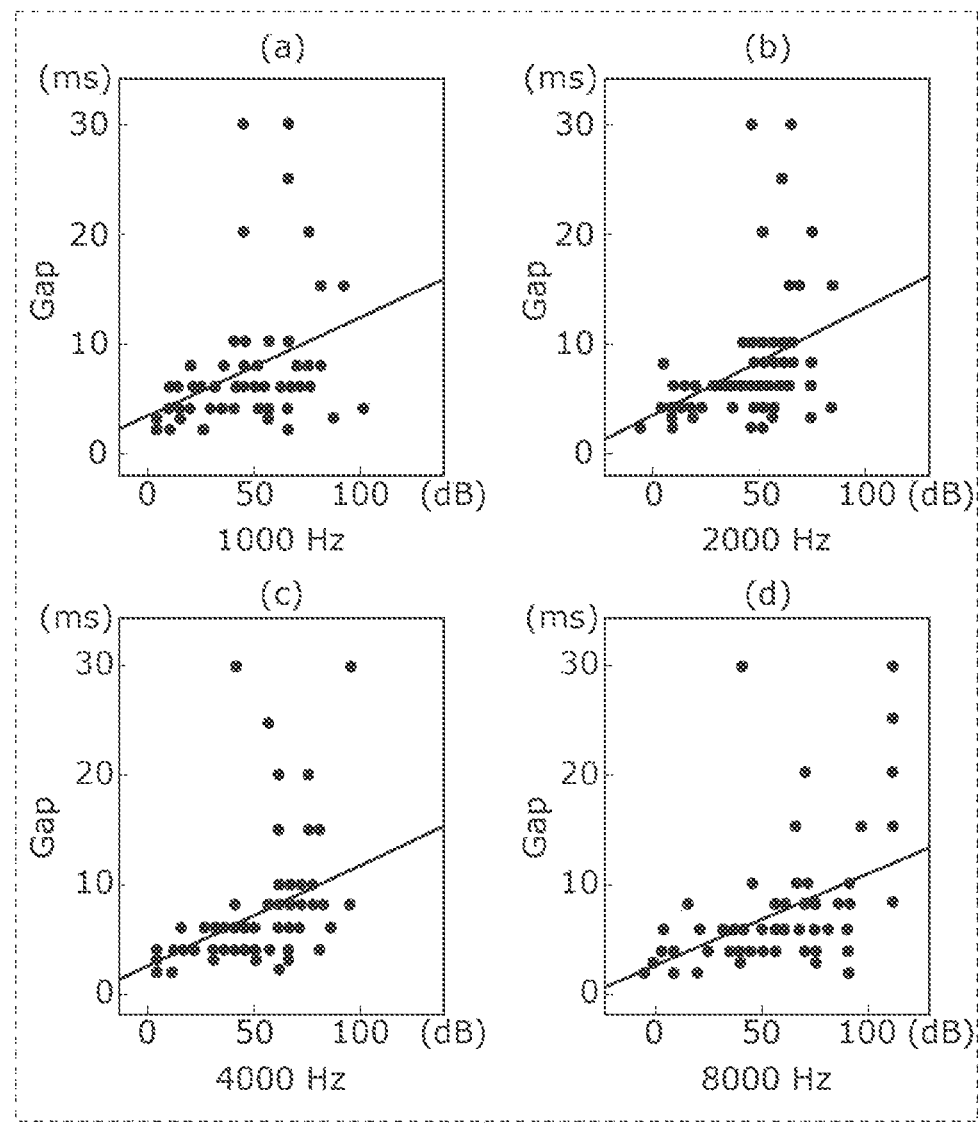
FIG. 14 is a diagram illustrating an example of the time constant in hearing aid processing in the related art.
FIG. 15 is a diagram illustrating the relation between the hearing level and the temporal resolution described in NPL 2.

FIG. 15 is a diagram illustrating the relation between the hearing level and the temporal resolution described in NPL 2. In FIG. 15, graphs (a) to (d) each show the relation between the hearing level and the temporal resolution obtained in a gap detection threshold test performed on hearing-impaired person of 11 to 75 years old. In the graphs, the abscissa indicates the detectable hearing level. In other words, the graphs show that the hearing ability reduces more significantly toward the right direction of the abscissa. The ordinate indicates the temporal resolution, i.e., the length of the gap between detectable sounds. The graphs show that the temporal resolution worsens more significantly toward the upper direction of the ordinate. The black dots in FIG. 15 represent the data of the subjects. The graphs (a), (b), (c), and (d) in FIG. 15 show the results of the tests using stimulating sounds having frequencies of 1 kHz, 2 kHz, 4 kHz, and 8 kHz, respectively. The graphs all show a tendency of rise from left to right, where the temporal resolution more significantly worsens as the hearing ability more significantly reduces. In particular, the temporal resolution is reduced to 20 msec through 30 msec in some cases. A worsened temporal resolution means that the subjects cannot perceive short sounds. The present inventors infer that this perception condition causes the state where hearing-impaired persons cannot perceive complex changes in frequencies at the beginnings of words and thus have difficulties in hearing words. Conversely, it can be expected that hearing easiness will be improved even to hearing-impaired persons by emphasizing the beginnings of words over about 20 msec or more.

In contrast, if this emphasis processing is continued too long, the sense of hearing becomes hypersensitive due to recruitment, causing discomfort such that sounds seem to sound louder in the head.

The duration time of a stimulating sound is 200 msec in a short increment sensitivity index (SISI) test, which is known as a test for examining the presence/absence of the condition of recruitment. This duration time means that the recruitment condition is induced by duration of a strong signal for 200 msec in a hearing-impaired person having such a recruitment condition. Accordingly, it is estimated that the time length for emphasizing the beginning of a word should be less than 200 msec.

Assuming that the time length for emphasizing the beginning of a word is 20 msec to 200 msec in consideration of these research findings in the related art, embodiments will now be described.

Moreover, using this method, a proofing test was performed on subjects, which were a large number of elderly persons including hearing-impaired persons, and it was verified that this method contributes to an improvement in hearing easiness to the elderly persons. Thus, the results will also be described in the embodiments.

Embodiment 1

The audio processing apparatus according to Embodiment 1 will be described.

[Configuration]

First, the functional configuration of the audio processing apparatus according to the present embodiment will be described with reference to the drawings. FIG. 1 is a block diagram illustrating one example of the functional configuration of audio processing apparatus 10 according to the present embodiment.

Audio processing apparatus 10 is an apparatus which processes a first sound and outputs the first sound from first loudspeaker 80. As illustrated in FIG. 1, audio processing apparatus 10 functionally includes first microphone 20, preprocessor 30, and rise emphasizer 40. In the present embodiment, audio processing apparatus 10 further includes first loudspeaker 80.

First microphone 20 converts the first sound to a first electric signal. In the present embodiment, first microphone 20 is designed such that the sounds uttered from an adjacent speaker are input. For this reason, in the first sound input to first microphone 20, the levels of the sounds uttered by the speaker are significantly larger than those of its surrounding noises.

Preprocessor 30 extracts a voice-band signal, i.e., a signal in a voice bandwidth from the first electric signal output by first microphone 20, and outputs a first output signal containing the voice-band signal. Here, the voice bandwidth indicates a frequency bandwidth including frequencies of the human voice. Specifically, the voice bandwidth is about 70 Hz or more and 3000 Hz or less. In the present embodiment, preprocessor 30 includes filter 32. Filter 32 is one example of a first filter which extracts the voice-band signal from the first electric signal. In the present embodiment, filter 32 is a low-pass filter which extracts a signal in a frequency bandwidth lower than or equal to a predetermined frequency from the first electric signal. For example, filter 32 extracts the signal in a frequency bandwidth of 8000 Hz or less from the first electric signal.

Rise emphasizer 40 is a processor to which the voice-band signal is input and which emphasizes a rising portion of the signal only for a predetermined time. The predetermined time is greater than or equal to the temporal resolution of the sense of hearing of a hearing-impaired person, and is less than the duration time of a sound which induces the recruitment in the hearing-impaired person. In the present embodiment, the first output signal is input as the voice-band signal. Rise emphasizer 40 emphasizes a rise portion of the first sound, i.e., the beginning of a word. Rise emphasizer 40 includes first controller 50 and first multiplier 44. In the present embodiment, rise emphasizer 40 further includes first setter 42.

First controller 50 is a processor which generates a first amplification coefficient to be multiplied with the first output signal (which is output by preprocessor 30) to compress the dynamic range of the intensity of the first output signal, and generates a first modified amplification coefficient by smoothing the first amplification coefficient with first time constant $\tau$. First time constant $\tau$ is first rise time constant ATT (i.e., the attack time constant) when the intensity of the first output signal increases, and is first decay time constant REL (i.e., release time constant) when the intensity of the first output signal decreases. First rise time constant ATT is greater than or equal to the temporal resolution of the sense of hearing of the hearing-impaired person, and is less than the duration time of a sound which induces the recruitment in the hearing-impaired person. Specifically, first rise time constant ATT is 20 msec or more and less than 200 msec, for example.

Figure 2:
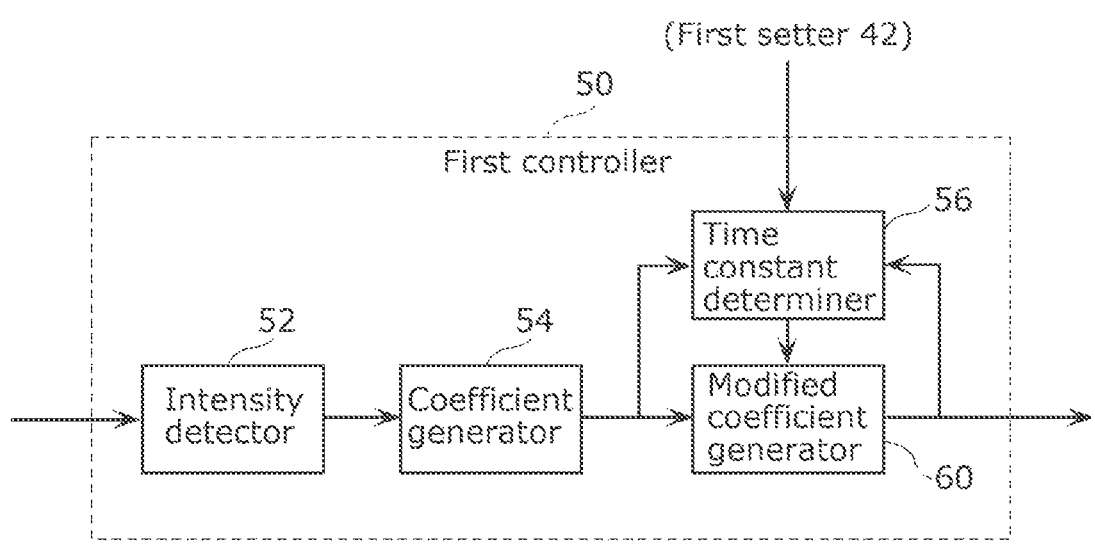
FIG. 2 is a block diagram illustrating one example of the functional configuration of the first controller according to Embodiment 1.

Here, first controller 50 will be described with reference to FIG. 2. FIG. 2 is a block diagram illustrating one example of the functional configuration of first controller 50 according to the present embodiment. As illustrated in FIG. 2, first controller 50 includes intensity detector 52, coefficient generator 54, time constant determiner 56, and modified coefficient generator 60.

Intensity detector 52 detects intensity E of the first output signal. Intensity detector 52 outputs the detected intensity E to coefficient generator 54.

Coefficient generator 54 is a processor which generates first amplification coefficient $G(t)$ that increases as intensity E decreases and decreases as intensity E increases. In other words, coefficient generator 54 generates first amplification coefficient $G(t)$ for compressing the dynamic range of the first output signal. Here, t indicates the time. Coefficient generator 54 outputs the generated first amplification coefficient to time constant determiner 56 and to modified coefficient generator 60.

Time constant determiner 56 is a processor which determines first time constant $\tau$, which is a time constant for smoothing processing used in modified coefficient generator 60.

Figure 3:
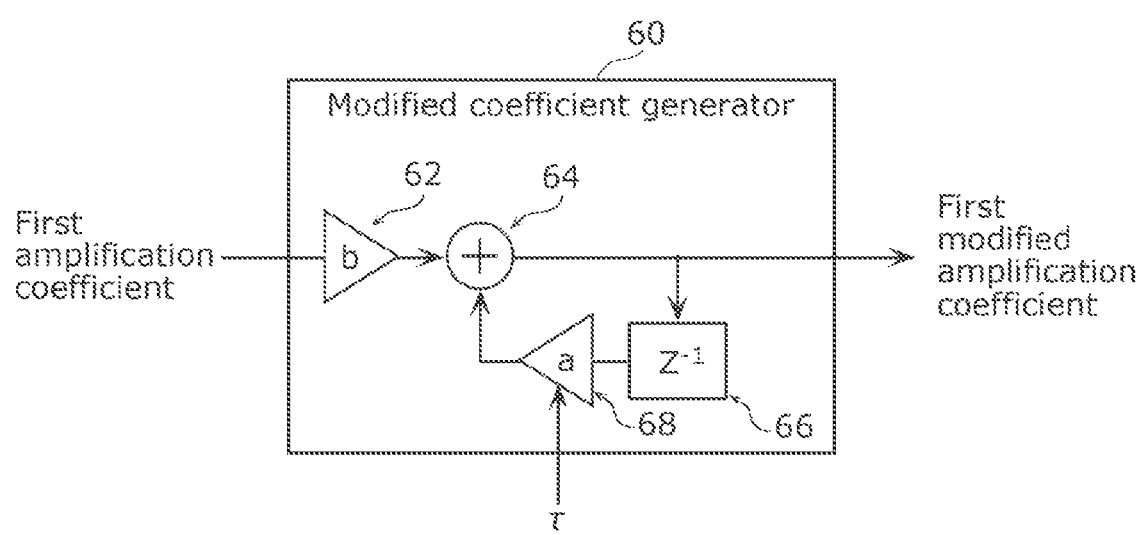
FIG. 3 is a block diagram illustrating one example of the functional configuration of the modified coefficient generator according to Embodiment 1.

Modified coefficient generator 60 is a processor which converts the first amplification coefficient to first modified amplification coefficient $mG(t)$ by smoothing the time fluctuation of first amplification coefficient $G(t)$ generated by coefficient generator 54. Here, an example of the configuration of modified coefficient generator 60 will be described with reference to FIG. 3. FIG. 3 is a block diagram illustrating one example of the functional configuration of modified coefficient generator 60 according to the present embodiment. As illustrated in FIG. 3, modified coefficient generator 60 includes multipliers 62 and 68, adder 64, and delay element 66. In other words, modified coefficient generator 60 is a digital filter whose time constant is first time constant $\tau$.

Adder 64 is a processor which adds two signals output by multipliers 62 and 68. Delay element 66 is a processor which delays the signal output by adder 64 by cycle T of unit processing. Cycle T of unit processing is the cycle for detecting intensity E of the first output signal by signal intensity detector 52, and thus the cycle for generating the first amplification coefficient by coefficient generator 54. For example, when the sampling frequency of the first output signal is 16 kHz, T is $\frac{1}{16000}$ sec in the case where the first amplification coefficient is generated for each sample, and T is $\frac{16}{16000}$ sec, that is, 1 msec in the case where the first amplification coefficient is generated for every 16 samples (in the case where the first amplification coefficient is determined for a group of 16 samples).

Multiplier 62 is a processor which multiplies first amplification coefficient $G(t)$ by factor b. Multiplier 68 is a processor which multiplies the intensity of the signal by factor a, the signal being output by delay element 66. First time constant $\tau$ from time constant determiner 56 is input to multiplier 68. Here, using first time constant $\tau$ and cycle T of unit processing, factor a of multiplier 68 and factor b of multiplier 62 are represented by Expressions (1) and (2):

$$a=\tau/(\tau+T) \quad (1)$$

$$b=1-a=T/(\tau+T) \quad (2)$$

First setter 42 illustrated in FIG. 1 sets first rise time constant ATT and first decay time constant REL. First setter 42 outputs the set first rise time constant ATT and first decay time constant REL to first controller 50. Thereby, first rise time constant ATT and first decay time constant REL can be set to desired values. To be noted, first setter 42 is not an essential component for audio processing apparatus 10 according to the present embodiment. For example, first rise time constant ATT and first decay time constant REL may be present in first controller 50.

First multiplier 44 is a processor which multiplies the first modified amplification coefficient and the first output signal. First multiplier 44 outputs the signal to first loudspeaker 80, the signal being obtained by multiplying the first modified amplification coefficient and the first output signal.

First loudspeaker 80 outputs the sound according to the output signal from first multiplier 44.

[Operation]

The operation of the audio processing apparatus having such a configuration will be described.

First, first microphone 20 collects the first sound containing the sounds uttered by the speaker, and converts the first sound to the first electric signal. Here, first microphone 20 is arranged such that the speaker utters sounds close to first microphone 20. First microphone 20 may be designed such that the speaker can see the position of the sound collecting hole of first microphone 20, for example. Alternatively, first microphone 20 may be designed such that when the speaker faces a camera which captures the face of the speaker, the mouth of the speaker becomes close to the sound collecting hole of first microphone 20. Such an arrangement of first microphone 20 controls the sounds uttered by the speaker to be the main component of the first sound input to first microphone 20. Thus, collection of noises having a large volume, which are generated near first microphone 20, can be suppressed. Accordingly, a risk can be reduced that unexpected output of noises having a large volume is not suppressed even by increasing first rise time constant ATT.

In the next step, filter 32 in preprocessor 30 extracts the voice-band signal from the first electric signal output from first microphone 20, and outputs the first output signal containing the voice-band signal. For example, here, the cutoff frequency of filter 32 is 8 kHz to control the sampling frequency to 16 kHz. This further ensures that the main component of the signal to be processed thereafter is the human voice signal. For this reason, as described later, a risk can be reduced that unexpected output of noises having a large volume is not suppressed even by increasing first rise time constant ATT in dynamic range compression. To be noted, filter 32 can have any cutoff frequency than 8 kHz. For example, filter 32 may have a cutoff frequency of about 3 kHz or more and 24 kHz or less.

In the next step, first controller 50 in rise emphasizer 40 generates the first modified amplification coefficient by smoothing the first amplification coefficient with first rise time constant ATT, the first amplification coefficient decreasing when intensity E of the first output signal from preprocessor 30 increases and by smoothing the first amplification coefficient with first decay time constant REL, the first amplification coefficient increasing when intensity E decreases.

Specifically, intensity detector 52 illustrated in FIG. 2 detects intensity E of the first output signal from preprocessor 30. For example, intensity E may be an absolute value of the first output signal, or may be energy thereof. As intensity E, the sum of absolute values of intensity E of the first output signal at several points of time may be determined, or a sum of squares may be determined. Here, in the case where intensity E is determined for each sample and the sampling frequency is 16 kHz, cycle T of unit processing described above is $\frac{1}{16000}$. In the case where intensity E is determined for a group of 16 samples, cycle T of unit processing is $\frac{16}{16000}$, i.e., 1 msec. A value obtained by multiplying the thus-determined value with a low-pass filter may be defined as intensity E.

Figure 4:
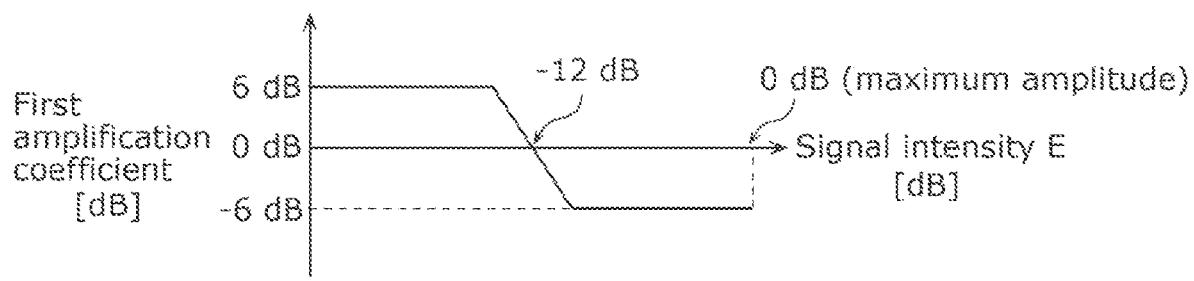
FIG. 4 is a graph showing one example of the relation between the first amplification coefficient according to Embodiment 1 and the intensity of the first output signal.

Subsequently, coefficient generator 54 illustrated in FIG. 2 generates the first amplification coefficient which increases as intensity E decreases and which decreases as intensity E increases. Such a first amplification coefficient will be described with reference to FIG. 4. FIG. 4 is a graph showing one example of the relation between the first amplification coefficient according to the present embodiment and intensity E of the first output signal. In FIG. 4, the abscissa indicates intensity E of the first output signal, and the ordinate indicates the first amplification coefficient corresponding to intensity E. The graph shows a tendency of drop from left to right, and the first amplification coefficient decreases as intensity E increases and the first amplification coefficient increases as intensify E decreases. In other words, the first amplification coefficient monotonically decreases with respect to intensity E. Here, as illustrated in FIG. 4, the monotonic decrease also includes the case where there is a range of intensity E in which the first amplification coefficient is constant to intensity E. Although the first amplification coefficient changes from a positive value to a negative value according to an increase in intensity E in FIG. 4, the first amplification coefficient does not always need to change across the boundary between positive and negative values, and may not increase as intensity E increases.

Figure 5:
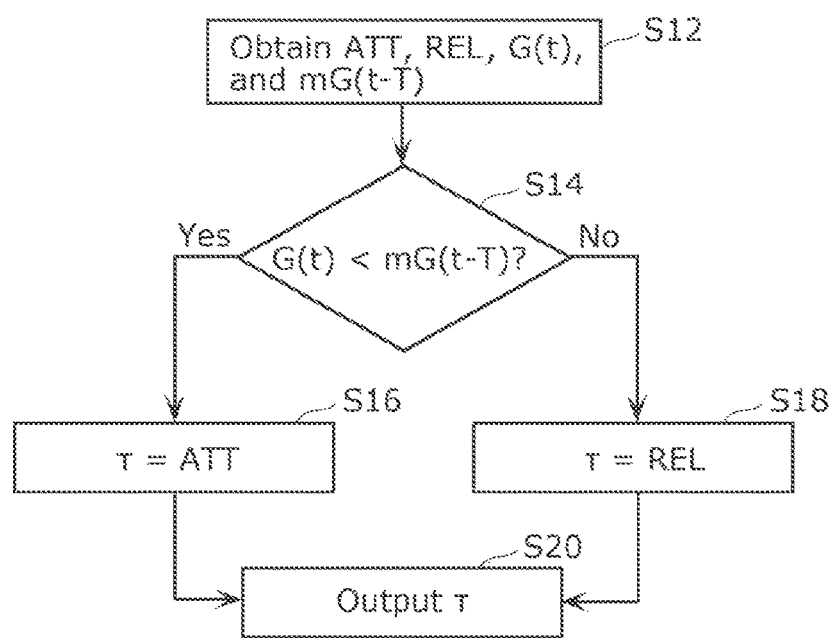
FIG. 5 is a flowchart illustrating one example of a method of determining the first time constant according to Embodiment 1.

Modified coefficient generator 60 smooths the time fluctuation of the first amplification coefficient generated as above to generate the first modified amplification coefficient. At this time, first time constant τ used in the smoothing processing is determined by time constant determiner 56. The method for determination will be described with reference to FIG. 5. FIG. 5 is a flowchart illustrating one example of the method of determining first time constant τ according to the present embodiment. As illustrated in FIG. 5, initially, time constant determiner 56 obtains first rise time constant ATT and first decay time constant REL from first setter 42. Furthermore, time constant determiner 56 obtains first amplification coefficient G(t) at the current time from coefficient generator 54, and obtains first modified amplification coefficient mG(t−T) at a time before cycle T of one unit processing from modified coefficient generator 60 (S12).

Subsequently, time constant determiner 56 compares first amplification coefficient G(t) to first modified amplification coefficient mG(t−T) (S14). If G(t)<mG(t−T) (Yes in S14), it means that the first amplification coefficient at the current time is smaller than that in the past, and thus intensity E at the current time is larger than that at the time before cycle T of one unit processing. In short, it indicates the state of attack (i.e., rise). In this case, time constant determiner 56 selects first rise time constant ATT as first time constant τ used in the smoothing processing (S16). If not so (No in S14), time constant determiner 56 selects first decay time constant REL (S18). Time constant determiner 56 outputs first time constant τ thus selected to modified coefficient generator 60 (S20). Using first time constant τ output by time constant determiner 56 as above, modified coefficient generator 60 described above smooths the time fluctuation of the first amplification coefficient to generate the first modified amplification coefficient.

In the present embodiment, first rise time constant ATT and first decay time constant REL are set by first setter 42. The specific values of these time constants are determined as above, for example.

Initially, first rise time constant ATT is greater than or equal to the temporal resolution of the sense of hearing of the hearing-impaired person who hears the first sound processed by audio processing apparatus 10, and is less than the duration time of the sound which induces the recruitment in the hearing-impaired person. Specifically, first rise time constant ATT is set to 20 msec or more and less than 200 msec, for example. The reason for this numeric range is as described in "How one aspect according to the present disclosure was obtained". Alternatively, first rise time constant ATT may be set to a value suitable for the hearing-impaired person who hears the first sound processed by audio processing apparatus 10. Specifically, the temporal resolution of the sense of hearing of each hearing-impaired person and the duration time of the sound which induces the recruitment may be measured, and first rise time constant ATT may be determined based on these numeric values obtained from the measurements.

Thus, by controlling the first rise time constant to be greater than or equal to the temporal resolution of the sense of hearing of the hearing-impaired person, quick suppression of the intensity of the sound of the beginning of a word can be prevented. In addition, by controlling the first rise time constant to be less than the duration time of the sound which induces the recruitment in the hearing impaired person, occurrence of the recruitment can be suppressed.

In contrast, first decay time constant REL in the related art is a value which is about several dozens times or more and several hundreds times or less larger than the rise time constant as illustrated in FIG. 14. However, because first rise time constant ATT can be set to a greater value in audio processing apparatus 10 according to the present embodiment, first decay time constant REL may not be a value as great as the value shown in FIG. 14. Specifically, first decay time constant REL may be as great as first rise time constant ATT (for example, less than 10 times larger than first rise time constant ATT), or may be smaller than first rise time constant ATT. For example, first rise time constant ATT may be 50 msec and first decay time constant REL may be 200 msec; or first rise time constant ATT may be 100 msec and first decay time constant REL may be 80 msec. Alternatively, first decay time constant REL may be less than 40 msec and first rise time constant ATT may be 40 msec or more.

Using first time constant τ set as above, in first controller 50, the first modified amplification coefficient is generated, and is multiplied with the first output signal to obtain the output signal. First loudspeaker 80, which receives the output signal, outputs a sound according to the output signal, thereby providing the processed sound to the hearing-impaired person, i.e., the listener.

Here, the reason why audio processing apparatus 10 having such a configuration described above converts the first sound to a signal which includes the emphasized beginning of a word such that the sound according to the signal is easy to hear to the hearing-impaired person will be described with reference to FIGS. 6A and 6B.

Figure 6A:
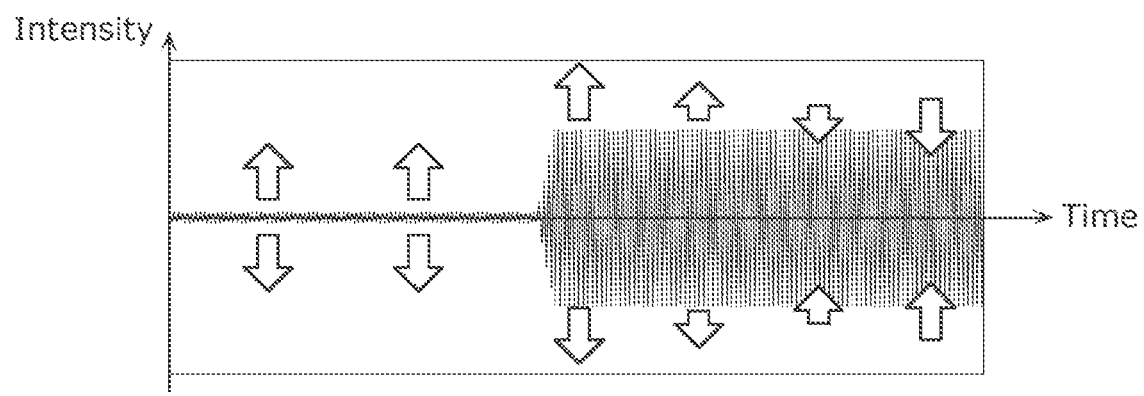
FIG. 6A is a diagram illustrating one example of the waveform of the rising portion of the first output signal according to Embodiment 1 and the level and direction of the first modified amplification coefficient to be multiplied with the first output signal at each time.

FIG. 6A is a diagram illustrating one example of the waveform of the rising portion (i.e., the beginning of a word) of the first output signal according to the present embodiment and the level and direction of the first modified amplification coefficient multiplied with the first output signal at each time. In FIG. 6A, amplification of the first output signal by the first modified amplification coefficient is represented by an arrow directed outwardly from the temporal axis, and decay of the first output signal by the first modified amplification coefficient is represented by an arrow directed toward the temporal axis. FIG. 6B is a graph showing the waveform of the signal obtained by multiplying the first output signal shown in FIG. 6A with the first modified amplification coefficient.

Because intensity E of the first output signal is low in the left side of FIG. 6A, namely, at a time before the rise of the sound, the first amplification coefficient has a great value. For example, this is converted to the relation between intensity E and the first amplification coefficient shown in FIG. 4; then the first amplification coefficient before the rise of the sound is always +6 dB. Here, because the first amplification coefficient is always +6 dB, the first modified amplification coefficient remains +6 dB even when the time fluctuation is smoothed. This is indicated by the arrows directed from the center to the outside in the left of FIG. 6A. Thus, the first output signal in the left side is obtained by adding +6 dB to the first output signal in FIG. 6A.

Subsequently, it is assumed that it is coming to the time for the rise of the sound. Because intensity E of the first output signal increases at this time, the first amplification coefficient decreases. For example, in the example shown in FIG. 4, the first amplification coefficient becomes −6 dB.

Because intensity E of the first output signal sharply increases at this time, it corresponds to the state of attack for the following reason. According to the method illustrated in FIG. 5, first amplification coefficient G(t) is −6 dB at the time immediately after intensity E of the first output signal sharply increases and first modified amplification coefficient mG(t−T) is +6 dB at the time before cycle T of unit processing. For this reason, Yes in step S14 in FIG. 5 (that is, attack side) is selected, and thus first rise time constant ATT is selected as first time constant t.

Here, first rise time constant ATT is set to a value greater than the temporal resolution of the hearing-impaired person, for example, to 40 msec. A time constant of 40 msec means that the time taken until the current first modified amplification coefficient reaches 63% of the target first modified amplification coefficient is about 40 msec. In the example shown in FIG. 4, the first amplification coefficient is +6 dB until cycle T of unit processing before the current time, and the first amplification coefficient is −6 dB at the current time. Thus, a time constant of 40 msec means that 40 msec is the time taken until the first amplification coefficient of +6 dB reaches 63% of the target first amplification coefficient of −6 dB. In other words, the first amplification coefficient remains a value greater than the target value (or the first output signal is being emphasized) at least for 40 msec. Such a state is represented by the arrows directed outwardly from the temporal axis in FIG. 6A for a while after the time of the rise of the first output signal.

Figure 6B:
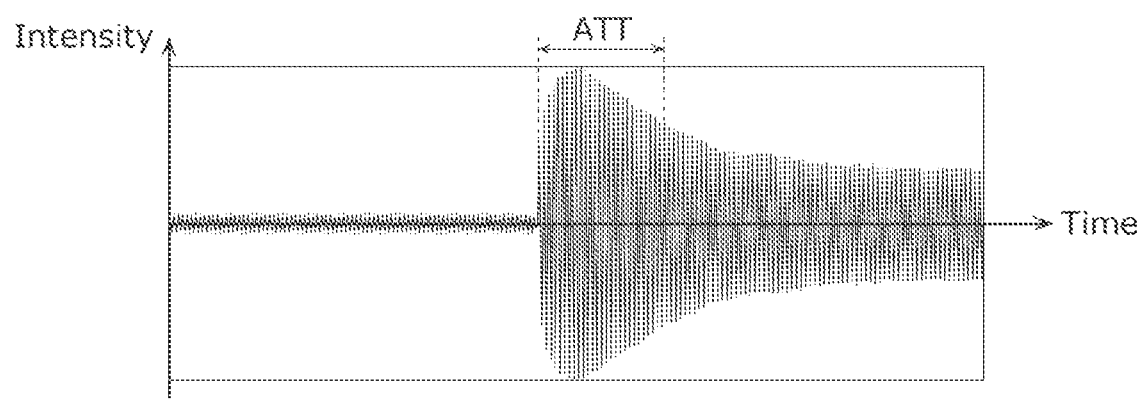
FIG. 6B is a graph showing the waveform of the signal obtained by multiplying the first output signal shown in FIG. 6A with the first modified amplification coefficient.

As a result, the waveform of the first output signal multiplied with the first modified amplification coefficient is as illustrated in FIG. 6B, where the rising portion (i.e., the beginning of a word) is emphasized. In the present embodiment, first rise time constant ATT is set to a value greater than the temporal resolution of the hearing-impaired person. For this reason, the beginning of the word is emphasized to enable even a hearing-impaired person to clearly perceive the sound. To be noted, a significantly large first rise time constant ATT induces the recruitment to provide an uncomfortable sound to the hearing-impaired person. Because it is known that the recruitment is induced after a loud sound continues over 200 msec, the first rise time constant should be less than 200 msec.

Thus, audio processing apparatus 10 according to the present embodiment includes rise emphasizer 40 to which the first output signal as a voice-band signal is input and which emphasizes the rising portion of the first output signal only for a predetermined time. The predetermined time is greater than or equal to the temporal resolution of the sense of hearing of the hearing-impaired person, and is less than the duration time of the sound which induces the recruitment in the hearing-impaired person, in such a configuration, the beginning of the word is emphasized over a time enabling the hearing impaired person to perceive the sound and the time length of the emphasis processing is short not to cause discomfort caused by the recruitment. Thus, the sound that the hearing-impaired person easily hears can be provided.

As described above, the first rise time constant may be a value greater than the first decay time constant. By setting the first rise time constant to a greater value as above, unnatural fluctuation of the sound can be suppressed even when the first decay time constant is small.

[Experimental Results]

Figure 7:
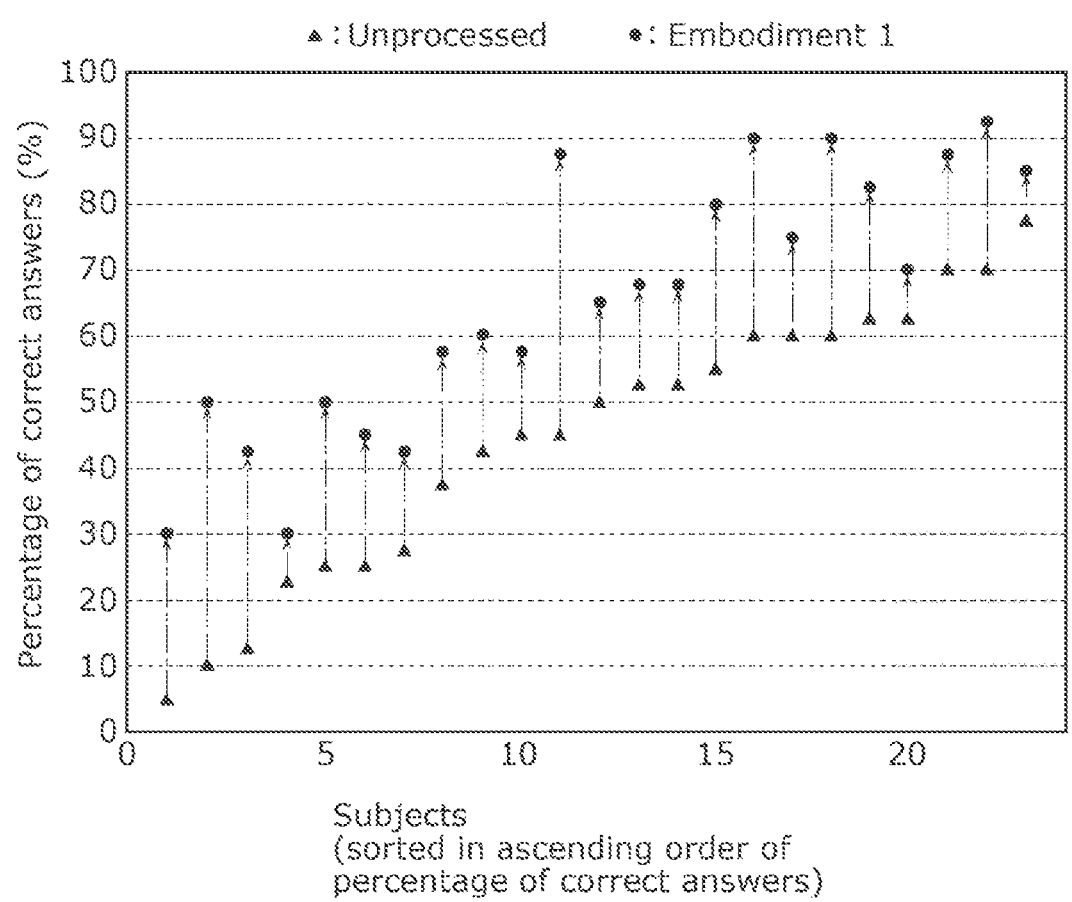
FIG. 7 is a graph showing the results of a proving test using the audio processing apparatus according to Embodiment 1.

Next, the results of a proofing test using audio processing apparatus 10 according to the present embodiment will be described with reference to FIG. 7. FIG. 7 is a graph showing the results of the proofing test using audio processing apparatus 10 according to the present embodiment. FIG. 7 shows the experimental results obtained from 23 subjects. In FIG. 7, the abscissa indicates the subjects in an ascending order of percentage of correct answers. In FIG. 7, the ordinate indicates the percentage of correct answers in the test.

In this test, based on the speech audiometry testing specified by Japan Audiological Society in 2003, a speech discrimination test was performed using a 67-S syllables list. Specifically, the subjects listened to monosyllables shown in the 67-S syllables list, and wrote those in hiragana letters. The percentage of correct answers were examined. The total of 23 subjects included 3 subjects of sixties, 18 subjects of seventies, and 2 subjects of eighties. The test was performed under two different conditions, i.e., one condition in which the subjects listened to unprocessed sounds of monosyllables and the other condition in which the subjects listened to the sounds of monosyllables processed by audio processing apparatus 10 according to the present embodiment. In audio processing apparatus 10, first rise time constant ATT and first decay time constant REL were set to 40 msec and 20 msec, respectively.

In FIG. 7, the percentages of correct answers when the subjects listened to the unprocessed sounds and those when the subjects listened to the sounds processed by audio processing apparatus 10 according to the present embodiment are represented by the black triangle and the black dot, respectively. The difference between these two types of percentage of correct answers is represented by the arrow.

As illustrated in FIG. 7, in both of the subjects who had a relatively high percentage of correct answers without remarkable hearing loss and those who had a relatively low percentage of correct answers with remarkable hearing loss, the percentage of correct answers for the sounds processed by audio processing apparatus 10 according to the present embodiment is higher than that for the unprocessed sounds.

Thus, the test has verified that audio processing apparatus 10 according to the present embodiment can output sounds easy to hear.

Embodiment 2

The audio processing apparatus according to Embodiment 2 will be described. As described above, in audio processing apparatus 10 according to Embodiment 1, the beginning of the word is surely emphasized immediately after the rise (attack), and then relatively slowly settles down to the target level according to the first rise time constant. To implement such an operation, as shown in FIG. 4, coefficient generator 54 generates a larger first amplification coefficient when intensity E of the first output signal is small. Thereby, an increase in amplitude of the signal can be ensured by increasing the time constant for smoothing when the first amplification coefficient decreases. To be noted, noises having a low intensity E of the first output signal are also unintentionally amplified in this case. For example, the first output signal on the left of FIG. 6B, that is, the signal corresponding to noises before utterance by the speaker is amplified.

Thus, an audio processing apparatus which can suppress such noises will be described in the present embodiment. The audio processing apparatus according to the present embodiment includes a preprocessor having a configuration different from that of audio processing apparatus 10 according to Embodiment 1. Differences of the audio processing apparatus according to the present embodiment from audio processing apparatus 10 according to Embodiment 1 will be mainly described below.

Figure 8:
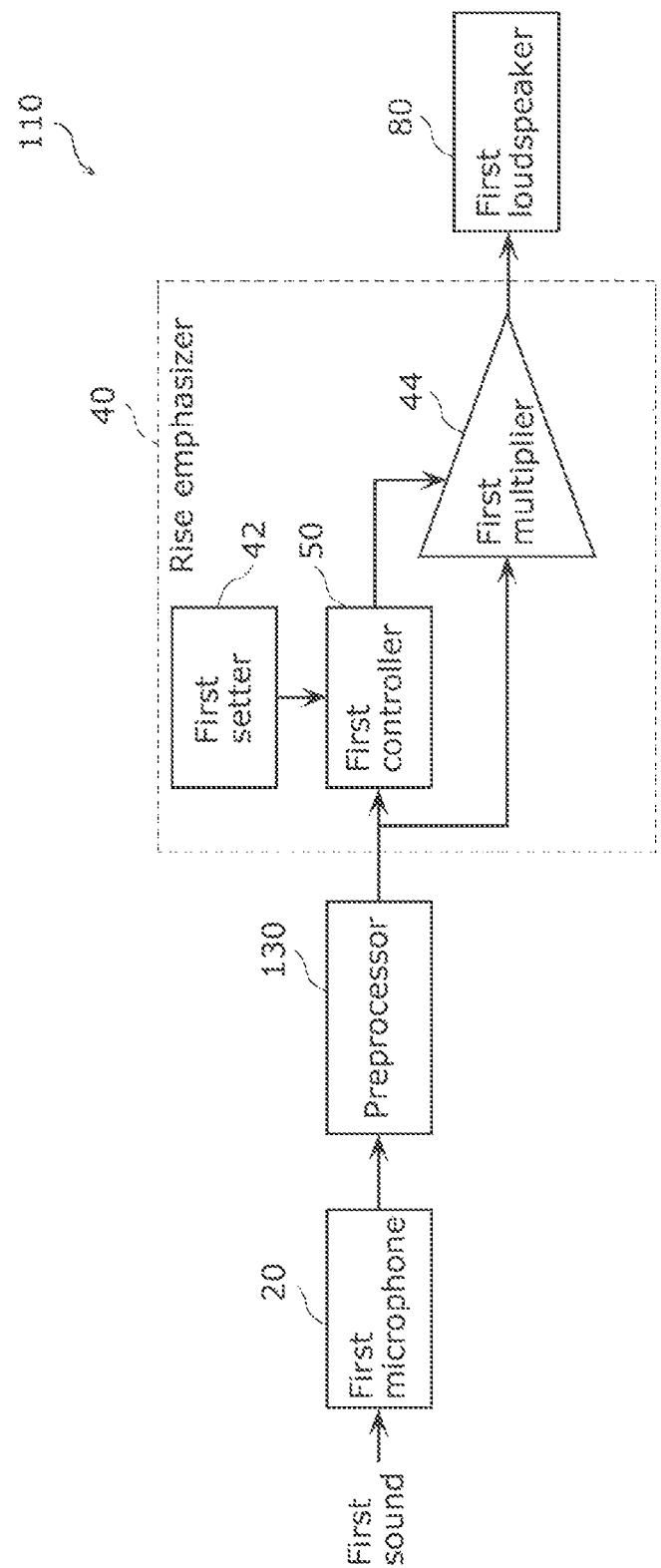
FIG. 8 is a block diagram illustrating one example of the functional configuration of the audio processing apparatus according to Embodiment 2.
Figure 9:
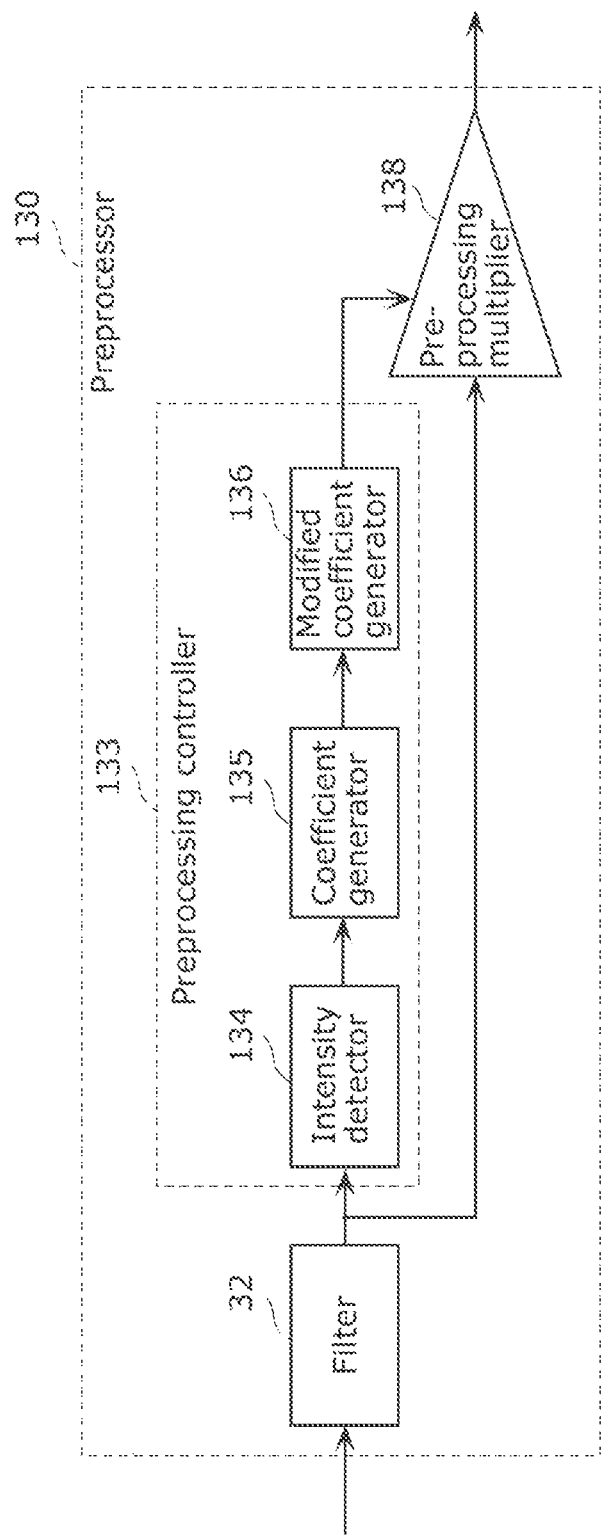
FIG. 9 is a block diagram illustrating one example of the functional configuration of the preprocessor according to Embodiment 2.

Initially, the functional configuration of the audio processing apparatus according to the present embodiment will be described with reference to FIGS. 8 and 9. FIG. 8 is a block diagram illustrating one example of the functional configuration of audio processing apparatus 110 according to the present embodiment. FIG. 9 is a block diagram illustrating one example of the functional configuration of preprocessor 130 according to the present embodiment.

As illustrated in FIG. 8, audio processing apparatus 110 according to the present embodiment functionally includes first microphone 20, preprocessor 130, and rise emphasizer 40. In the present embodiment, audio processing apparatus 110 further includes first loudspeaker 80. As illustrated in FIG. 8, the configuration of preprocessor 130 in audio processing apparatus 110 according to the present embodiment is different from that of the preprocessor in audio processing apparatus 10 according to Embodiment 1.

As illustrated in FIG. 9, preprocessor 130 according to the present embodiment includes filter 32, preprocessing controller 133, and preprocessing multiplier 138. Similarly to filter 32 according to Embodiment 1, filter 32 is one example of the first filter which extracts a voice-band signal from the first electric signal output by first microphone 20.

Preprocessing controller 133 generates a preprocess amplification coefficient based on the output signal from filter 32. As illustrated in FIG. 9, preprocessing controller 133 includes intensity detector 134, coefficient generator 135, and modified coefficient generator 136.

Intensity detector 134 detects intensity E of the output signal from filter 32. Intensity detector 134 may detect intensity E as in intensity detector 52 according to Embodiment 1. Intensity detector 134 outputs the detected intensity E to coefficient generator 135.

Figure 10:
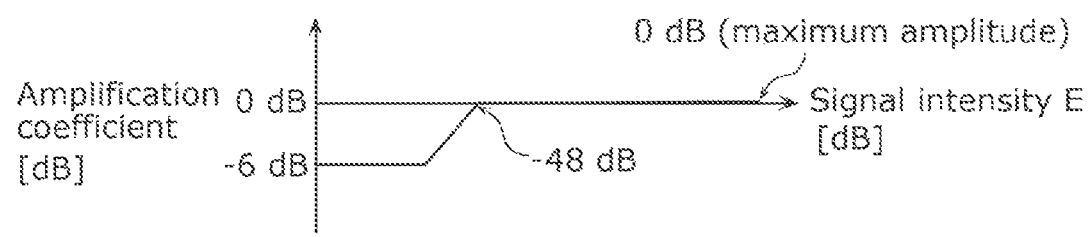
FIG. 10 is a graph showing one example of the relation between the preprocess amplification coefficient according to Embodiment 2 and intensity E of the output signal from the filter.

Coefficient generator 135 is a processor which generates a preprocess amplification coefficient. The preprocess amplification coefficient varies according to intensity E of the output signal from filter 32. The preprocess amplification coefficient is smaller when intensity E of the output signal from filter 32 is lower than a predetermined threshold than when intensity E thereof is higher than the predetermined threshold. The preprocess amplification coefficient will now be described with reference to FIG. 10. FIG. 10 is a graph showing one example of the relation between the preprocess amplification coefficient according to the present embodiment and intensity E of the output signal from filter 32. As illustrated in FIG. 10, the preprocess amplification coefficient increases as intensity E of the output signal from filter 32 increases. For example, the preprocess amplification coefficient may be −6 dB in the range of intensity E where the first amplification coefficient shown in FIG. 4 is +6 dB, and may be 0 dB in the range of intensity E where the first amplification coefficient shown in FIG. 4 is −6 dB. In the example shown in FIG. 10, the preprocess amplification coefficient is smaller when intensity E is lower than a predetermined threshold of −48 dB than when intensity E is higher than the threshold of −48 dB. Specifically, when intensity E is lower than the predetermined threshold of −48 dB, the preprocess amplification coefficient decreases as intensity E decreases; and when intensity E is lower than or equal to predetermined intensity E, the preprocess amplification coefficient is −6 dB. In contrast, when intensity E is higher than the predetermined threshold of −48 dB, the preprocess amplification coefficient is 0 dB.

Modified coefficient generator 136 is a processor which modifies the preprocess amplification coefficient by smoothing the time fluctuation of the preprocess amplification coefficient. Modified coefficient generator 136 outputs the preprocess amplification coefficient after modification to preprocessing multiplier 138. To be noted, modified coefficient generator 136 is not an essential component for audio processing apparatus 110. In other words, the preprocess amplification coefficient generated by coefficient generator 135 may be input as it is to preprocessing multiplier 138.

Preprocessing multiplier 138 is a processor which multiplies the output signal from filter 32 and the preprocess amplification coefficient. Preprocessing multiplier 138 outputs a first output signal to rise emphasizer 40, the first output signal being a signal obtained by multiplying the output signal from filter 32 and the preprocess amplification coefficient.

As described above, preprocessor 130 according to the present embodiment outputs the first output signal obtained by decaying the signal having low intensity E. Thereby, while amplification of the noise component having low intensity E by rise emphasizer 40 is reduced, suppression of the beginning of the word, which should be emphasized, can be reduced.

Embodiment 3

The audio processing apparatus according to Embodiment 3 will be described. The audio processing apparatus according to the present embodiment includes a processor which processes a second sound, in addition to the processor which processes the first sound. Differences of the audio processing apparatus according to the present embodiment from audio processing apparatus 10 according to Embodiment 1 will be mainly described below.

Figure 11:
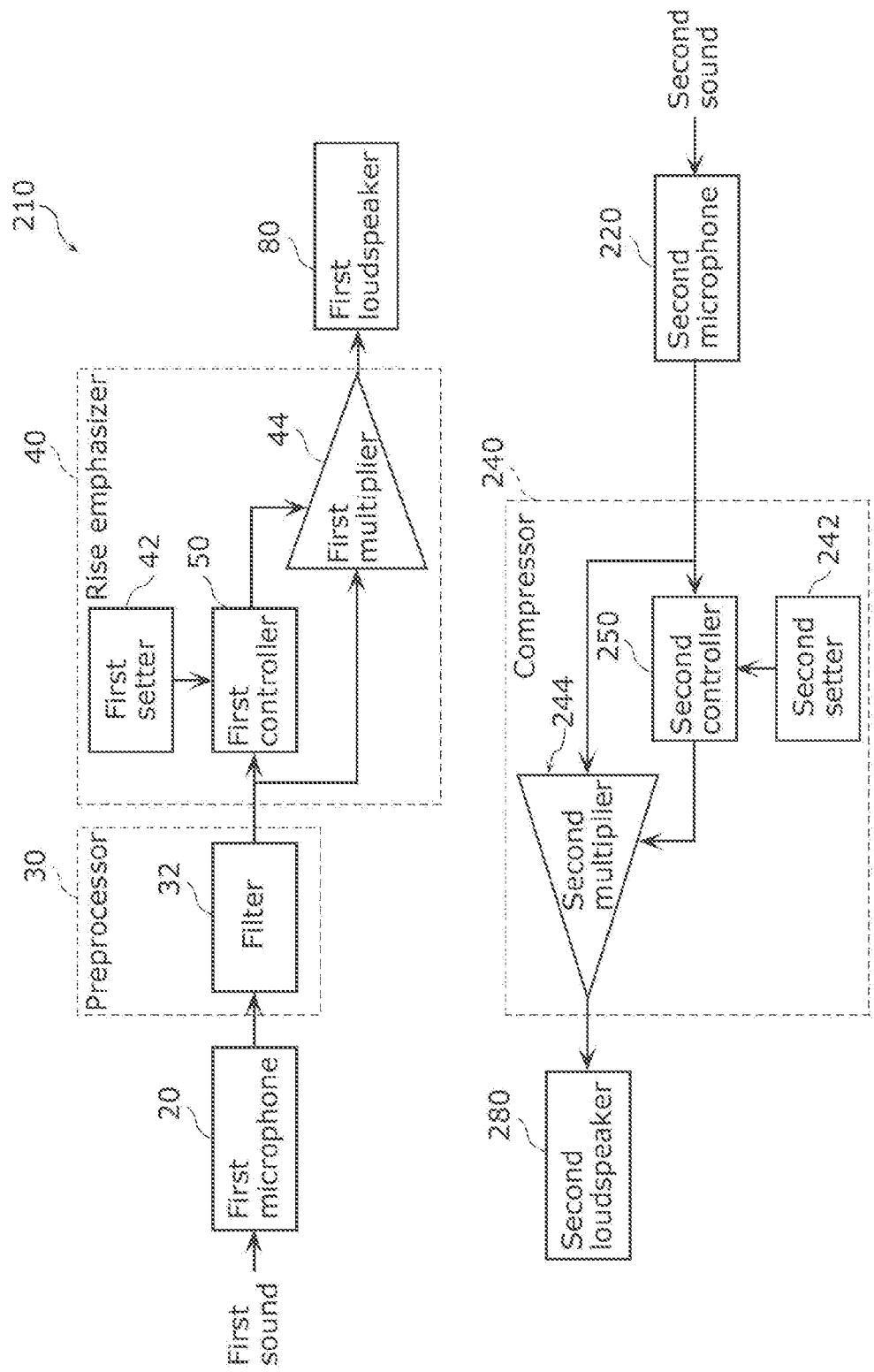
FIG. 11 is a block diagram illustrating one example of the functional configuration of the audio processing apparatus according to Embodiment 3.

Initially, the functional configuration of the audio processing apparatus according to the present embodiment will be described with reference to FIG. 11. FIG. 11 is a block diagram illustrating one example of the functional configuration of audio processing apparatus 210 according to the present embodiment.

As illustrated in FIG. 11, audio processing apparatus 210 functionally includes first microphone 20, preprocessor 30, rise emphasizer 40, second microphone 220, and compressor 240. In the present embodiment, audio processing apparatus 210 further includes first loudspeaker 80 and second loudspeaker 280. For example, audio processing apparatus 210 includes second microphone 220 disposed near first loudspeaker 80, and second loudspeaker 280 disposed near first microphone 20, and such a configuration enables processing of the sound in two directions, i.e., the direction from first microphone 20 toward first loudspeaker 80 and the direction from second microphone 220 toward second loudspeaker 280. In other words, audio processing apparatus 210 according to the present embodiment can bidirectionally process the sounds in a conversation between a first user who utters the first sound and a second user who utters the second sound.

First microphone 20, preprocessor 30, rise emphasizer 40, and first loudspeaker 80 according to the present embodiment have identical configurations to those of first microphone 20, preprocessor 30, rise emphasizer 40, and first loudspeaker 80 according to Embodiment 1.

Second microphone 220 converts the second sound to a second electric signal. In the present embodiment, the sound input to second microphone 220 is not limited to the sound uttered by a nearby speaker. For example, second microphone 220 may be designed such that the sound uttered by a speaker who is difficult to come close to second microphone 220 is input as the second sound. In this case, in the second sound input to second microphone 220, the level of surrounding noises can be relatively higher than the level of the sound uttered by the speaker.

Compressor 240 compresses the dynamic range of a second output signal according to the second electric signal output from second microphone 220. Although the second output signal is identical to the second electric signal in the present embodiment, the second output signal may be a signal obtained by processing the second electric signal by a preprocessor identical to the preprocessor according to Embodiment 1 or 2. In other words, audio processing apparatus 210 according to the present embodiment may further include a preprocessor which generates the second output signal by processing the second electric signal from second microphone 220 and outputs the second output signal to compressor 240. Compressor 240 includes second controller 250 and second setter 242. In the present embodiment, compressor 240 further includes second multiplier 244.

Second controller 250 is a processor which generates a second amplification coefficient to be multiplied with the second output signal to compress the dynamic range of the intensity of the second output signal, and generates a second modified amplification coefficient by smoothing the second amplification coefficient with a second time constant. The second time constant is a second rise time constant when the intensity of the second output signal increases, and is a second decay time constant when the intensity of the second output signal decreases. Second controller 250 has a configuration identical to that of first controller 50. Here, the first rise time constant set by first setter 42 is greater than the second rise time constant set by second setter 242, and the first decay time constant set by first setter 42 is smaller than the second decay time constant set by second setter 242.

Second setter 242 sets the second rise time constant and the second decay time constant. Second setter 242 outputs the set second rise time constant and the set second decay time constant to second controller 250. Thereby, the second rise time constant and the second decay time constant can be set to desired values. To be noted, second setter 242 is not an essential component for audio processing apparatus 210 according to the present embodiment. For example, the second rise time constant and the second decay time constant may be preset in second controller 250.

Second multiplier 244 is a processor which multiplies the second modified amplification coefficient and the second output signal. Second multiplier 244 outputs the signal obtained by multiplying the second modified amplification coefficient and the second output signal to second loudspeaker 280.

Audio processing apparatus 210 according to the present embodiment having such a configuration can process the sound in two directions, i.e., in the direction from first microphone 20 toward first loudspeaker 80 and the direction from second microphone 220 toward second loudspeaker 280. Because the first rise time constant set by first setter 42 is greater than the second rise time constant set by second setter 242 in the present embodiment, the beginning of the first sound is emphasized as in audio processing apparatus 10 according to Embodiment 1. Accordingly, in the case where the sounds uttered in a conversation between the first user who is not a hearing-impaired person and utters the first sound and the second user who is a hearing-impaired person and utters the second sound are bidirectionally processed, the second user can hear the sounds easy to hear from first loudspeaker 80.

In contrast, in the case where the second user utters the sound in a place not close to second microphone 220, the second sound contains a relatively large amount of noises other than the sounds uttered by the second user. Even in such a case, the dynamic range of the second output signal corresponding to the second sound is compressed by compressor 240, and thus a large volume of noises contained in the second sound can be suppressed.

Because audio processing apparatus 210 according to the present embodiment provides such effects, audio processing apparatus 210 can be applied to a nurse call system, for example. In this case, a nurse uses first microphone 20 and second loudspeaker 280, and a patient, which is a hearing-impaired person, uses second microphone 220 and first loudspeaker 80. This facilitates hearing of the nurse's voice by the patient. The patient cannot come close to second microphone 220 in some cases. To treat such cases, for example, the sensitivity of second microphone 220 is increased compared to that of first microphone 20, thereby implementing audio processing apparatus 210 which such a patient can use.

Modifications

Although the audio processing apparatuses according to the present disclosure have been described above based on the embodiments, these embodiments should not be construed as limitations to the present disclosure. The present disclosure also covers a variety of modifications of the embodiments conceived and made by persons skilled in the art, and other embodiments including combinations of some of the components of the embodiments without departing from the gist of the present disclosure.

Figure 12:
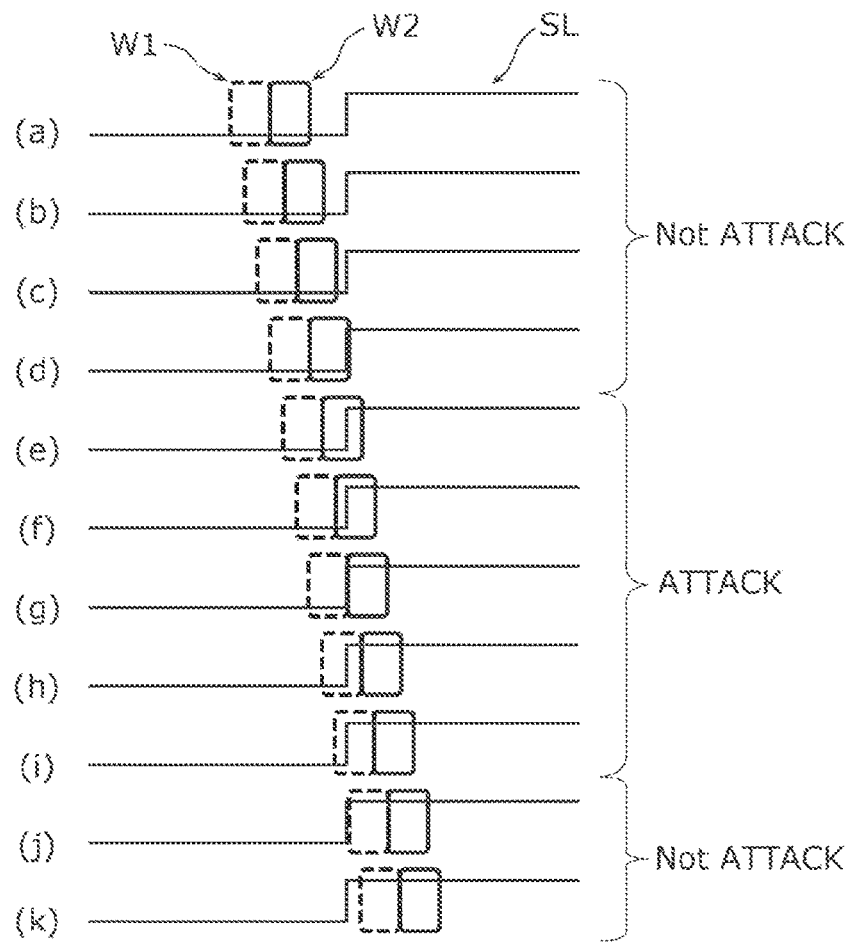
FIG. 12 is a diagram illustrating a method of determining the first time constant according to a modification.

For example, although the first time constant has been determined based on the first amplification coefficient and the first modified amplification coefficient in the embodiments above, the first time constant can be determined by any other method. For example, the first time constant may be determined based on whether the first output signal is in the state of attack. Such a method will be described with reference to FIG. 12. FIG. 12 is a diagram illustrating the method of determining the first time constant according to a modification. Where the abscissa indicates the temporal axis, FIG. 12 illustrates first output signal SL whose energy changes step-wise according to the time and the outline of windows W1 and W2 showing the detection periods for detecting whether the first output signal is in the state of attack.

As illustrated in FIG. 12, whether the first output signal rises (i.e., is in the state of attack) can be determined by detecting the energy within the window using window W1 and window W2 subsequent to window W1. For example, there is no change in energy between the two windows in the case where the positions of windows W1 and W2 are as shown in waveforms (a) to (d), (j), and (k) of FIG. 12. From this, it can be determined that the first output signal does not rise (i.e., is not in the state of attack). The energy detected by window W2 is higher than that detected by window W1 in the case where the positions of windows W1 and W2 are as shown in waveforms (e) to (i) of FIG. 12. From this, it can be determined that the first output signal rises (i.e., is in the state of attack).

As above, the first time constant can be determined based on whether the first output signal is in the state of attack. In the case where such a method is used, the audio processing apparatus may include a memory which temporarily stores the energy detected by window W1.

Figure 13:
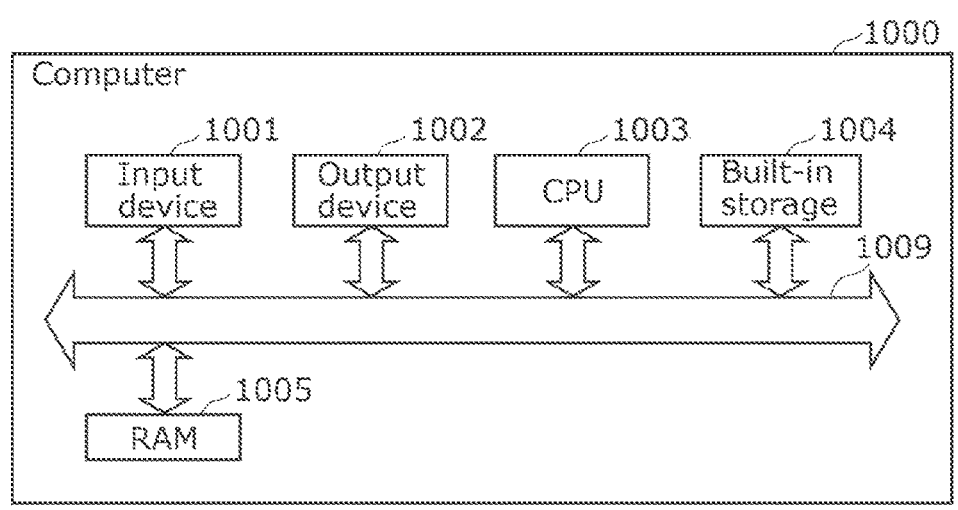
FIG. 13 is a diagram illustrating one example of the hardware configuration of a computer which implements the functions of the audio processing apparatus with software.

Embodiments shown below may also be included in the scope of one or a plurality of aspects according to the present disclosure. (1) Although not particularly limited, the hardware configuration of the components which constitute each of the audio processing apparatuses above may be configured with a computer, for example. An example of such a hardware configuration will be described with reference to FIG. 13. FIG. 13 is a diagram illustrating one example of the hardware configuration of computer 1000 which implements the functions of the audio processing apparatus according to the present disclosure by software.

As illustrated in FIG. 13, computer 1000 includes input device 1001, output device 1002, CPU 1003, built-in storage 1004, RAM 1005, and bus 1009. Input device 1001, output device 1002, CPU 1003, built-in storage 1004, and RAM 1005 are connected through bus 1009.

Input device 1001 is a device which serves as a user interface, for example, an input button, a touch pad, or a touch panel display, and accepts an operation by a user. Input device 1001 may be configured to accept a vocal operation or a remote operation with a remote controller, other than the contact operation by the user. Input device 1001 may include microphones corresponding to first microphone 20 and second microphone 220.

Output device 1002 outputs a signal from computer 1000, and may be a device which serves as a user interface, for example, a signal output terminal, a loudspeaker, or a display. Output device 1002 may include loudspeakers corresponding to first loudspeaker 80 and second loudspeaker 280.

Built-in storage 1004 is a flash memory, for example. Built-in storage 1004 may preliminarily store at least one of a program for implementing the functions of the audio processing apparatus or an application utilizing the functional configuration of the audio processing apparatus.

RAM 1005 is a random access memory, which is used for storing data when the program or the application is performed.

CPU 1003 is a central processing unit, and copies the program or application stored in built-in storage 1004 to RAM 1005 to sequentially read commands contained in the program or the application from RAM 1005 and then execute the commands.

For example, computer 1000 may process the first electric signal and the second electric signal, which are both made of digital signals, in the same manner as those in the preprocessor, the rise emphasizer, and the compressor according to the embodiments above.

(2) Part of the components which configure the audio processing apparatus may be configured with one system large scale integration (LSI). The system LSI is an ultra-multifunctional LSI produced by integrating a plurality of configurations on a single chip, and specifically is a computer system including a microprocessor, a ROM, a RAM, and the like. The RAM stores computer programs. The microprocessor operates according to the computer programs, and thus the system LSI attains its functions.

(3) Part of the components which configure the audio processing apparatus may be configured with an IC card or a single module detachably attachable to devices. The IC card or the module is a computer system including a microprocessor, a ROM, a RAM, and the like. The IC card or the module may include the ultra-multifunctional LSI. The microprocessor operates according to computer programs, and thus the IC card or the module attains its functions. This IC card or module may have tamper proofness.

(4) Part of the components which configure the audio processing apparatus may be a computer-readable recording medium, such as a flexible disc, a hard disk, a CD-ROM, an MO, a DVD, a DVD-ROM, a DVD-RAM, a Blu-ray (registered trademark) disc (BD), or a semiconductor memory having the computer programs or the digital signals recorded thereon. Alternatively, part of the components which configure the audio processing apparatus may be the digital signals recorded on these recording media.

Alternatively, part of the components which configure the audio processing apparatus may be the computer programs or the digital signals transmitted through an electric communication line, a wireless or wired communication line, a network such as the Internet, or data broadcasting.

(5) The present disclosure may be the methods described above. Alternatively, the present disclosure may be computer programs executed by a computer to implement these methods, or may be digital signals of the computer programs.

(6) Alternatively, the present disclosure may be a computer system including a memory and a microprocessor. The memory may store the computer programs, and the microprocessor may operate according to the computer programs.

(7) Alternatively, the present disclosure may be implemented by a different independent computer system by transporting the programs or the digital signals recorded on the recording medium or by transporting the programs or the digital signals through the network.

(8) The embodiments and the modifications may be combined.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The audio processing apparatus according to the present disclosure can provide sounds easy to hear to hearing-impaired persons, and therefor can be used in intercoms for residences where hearing-impaired persons live, nurse call systems for hospitals, and the like. The audio processing apparatus according to the present disclosure can also be used in television receivers which hearing-impaired persons listen to, thereby improving hearing easiness of the sounds from television programs.

The invention claimed is:

1. An audio processing apparatus, comprising:
a first microphone which converts a first sound to a first electric signal;
a preprocessor which extracts a voice-band signal from the first electric signal, and outputs a first output signal containing the voice-band signal;
a first controller which generates a first amplification coefficient to be multiplied with the first output signal to compress a dynamic range of an intensity of the first output signal, and generates a first modified amplification coefficient by smoothing the first amplification coefficient with a first time constant; and
a first multiplier which multiplies the first modified amplification coefficient and the first output signal, wherein:
the first time constant is a first rise time constant when the intensity of the first output signal increases, and is a first decay time constant when the intensity of the first output signal decreases,
the first rise time constant is greater than or equal to a temporal resolution of a sense of hearing of a hearing-impaired person, and is less than a duration time of a sound which induces recruitment in the hearing-impaired person, and
the first rise time constant is greater than the first decay time constant.

2. The audio processing apparatus according to claim 1, further comprising:
a first setter which sets the first rise time constant and the first decay time constant.

3. The audio processing apparatus according to claim 1, wherein the first rise time constant is a value of 20 msec or more and less than 200 msec.

4. The audio processing apparatus according to claim 1, wherein the preprocessor includes:
a first filter which extracts the voice-band signal from the first electric signal; and
a preprocessing multiplier which multiplies an output signal from the first filter and a preprocess amplification coefficient, and
the preprocess amplification coefficient is smaller when an intensity of the output signal from the first filter is lower than a predetermined threshold than when the intensity of the output signal from the first filter is higher than the predetermined threshold.

5. An audio processing apparatus, comprising:
a first microphone which converts a first sound to a first electric signal;
a preprocessor which extracts a voice-band signal from the first electric signal, and outputs a first output signal containing the voice-band signal;

a first controller which generates a first amplification coefficient to be multiplied with the first output signal to compress a dynamic range of an intensity of the first output signal, and generates a first modified amplification coefficient by smoothing the first amplification coefficient with a first time constant; and a first multiplier which multiplies the first modified amplification coefficient and the first output signal, wherein:

the first time constant is a first rise time constant when the intensity of the first output signal increases, and is a first decay time constant when the intensity of the first output signal decreases, the first rise time constant is greater than or equal to a temporal resolution of a sense of hearing of a hearing-impaired person, and is less than a duration time of a sound which induces recruitment in the hearing-impaired person, the preprocessor includes:

a first filter which extracts the voice-band signal from the first electric signal; and a preprocessing multiplier which multiplies an output signal from the first filter and a preprocess amplification coefficient, and the preprocess amplification coefficient is smaller when an intensity of the output signal from the first filter is lower than a predetermined threshold than when the intensity of the output signal from the first filter is higher than the predetermined threshold.

6. The audio processing apparatus according to claim 5, further comprising:

a first setter which sets the first rise time constant and the first decay time constant.

7. The audio processing apparatus according to claim 5, wherein the first rise time constant is a value of 20 msec or more and less than 200 msec.

* * * * *